United States Patent
Smith et al.

(10) Patent No.: US 11,860,016 B2
(45) Date of Patent: Jan. 2, 2024

(54) MEMS-BASED CORIOLIS MASS FLOW CONTROLLER

(71) Applicant: LAM RESEARCH CORPORATION, Fremont, CA (US)

(72) Inventors: Dennis Smith, San Jose, CA (US); Peter Reimer, San Jose, CA (US); Sudhakar Gopalakrishnan, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 379 days.

(21) Appl. No.: 17/042,059

(22) PCT Filed: Mar. 28, 2019

(86) PCT No.: PCT/US2019/024583
§ 371 (c)(1),
(2) Date: Sep. 25, 2020

(87) PCT Pub. No.: WO2019/191428
PCT Pub. Date: Oct. 3, 2019

(65) Prior Publication Data
US 2021/0096011 A1    Apr. 1, 2021

Related U.S. Application Data

(60) Provisional application No. 62/650,657, filed on Mar. 30, 2018.

(51) Int. Cl.
*G01F 1/84* (2006.01)
*G01F 15/00* (2006.01)
(Continued)

(52) U.S. Cl.
CPC .......... *G01F 1/8445* (2013.01); *G01F 1/8422* (2013.01); *G01F 1/8427* (2013.01);
(Continued)

(58) Field of Classification Search
CPC ...... G01F 1/8409; G01F 1/844; G01F 1/8445; H01L 21/67253
See application file for complete search history.

(56) References Cited

U.S. PATENT DOCUMENTS 6,418,954 B1 *  7/2002  Taylor ................. G05D 11/132
                                            137/101.21
6,526,839 B1 *  3/2003  Barger ................. G01F 1/8409
                                             73/861.354
(Continued)

FOREIGN PATENT DOCUMENTS

JP      2016042047 A    3/2016
WO   WO-2009102763 A1   8/2009

OTHER PUBLICATIONS

Groenesteijn et al. "Single-Chip Mass Flow Controller with Integrated Coriol is Flow Sensor and Proportional Control Valve." In: 2016 IEEE 29th International Conference on Micro Electro Mechanical Systems (MEMS), IEEE, Feb. 29, 2016. pp. 788-791.
(Continued)

*Primary Examiner* — Erika J. Villaluna (57) ABSTRACT

A mass flow controller assembly includes a housing defining a cavity, a plurality of internal passages, a first inlet, a first outlet, a second inlet, and a second outlet. A valve is connected to the housing, has an inlet fluidly coupled to the second outlet of the housing and an outlet fluidly coupled to the second inlet of the housing. The valve is configured to control fluid flow from the second outlet of the housing to the second inlet of the housing. A microelectromechanical (MEMS) Coriolis flow sensor is arranged in the cavity, includes an inlet fluidly coupled by at least one of the plurality of internal passages to the first inlet of the housing and is configured to measure at least one of a mass flow rate and density of fluid flowing through the MEMS Coriolis flow sensor. An outlet of the MEMS Coriolis flow sensor is
(Continued)

fluidly coupled by at least one of the plurality of internal passages to the second outlet of the housing. The second inlet of the housing is fluidly coupled by at least one of the plurality of internal passages to the first outlet of the housing.

23 Claims, 7 Drawing Sheets

(51) Int. Cl.
  *G01F 15/12* (2006.01)
  *G01N 9/32* (2006.01)
  *H01L 21/67* (2006.01)
  *G05D 7/06* (2006.01)

(52) U.S. Cl.
  CPC .......... *G01F 1/8431* (2013.01); *G01F 15/005* (2013.01); *G01F 15/125* (2013.01); *G01N 9/32* (2013.01); *H01L 21/67253* (2013.01); *G05D 7/0688* (2013.01)

(56) References Cited

U.S. PATENT DOCUMENTS 8,999,018 B2 * 4/2015 Yoon .................... B01J 19/088
  204/168
2015/0104575 A1 4/2015 Takoudis et al.
2016/0018829 A1 1/2016 Ellec et al.

OTHER PUBLICATIONS

Haneveld et al. "Micro-Coriolis Mass Flow Sensor with Integrated Capacitive Readout", J. Haneveld, T. S. J. Lammerink, M. J. de Boer and R. J. Wiegerink, 978-1-4244-2978-3/09 I.E.E.E. Transactions of Industrial Electronics (2009).

Sparks et al. "Coriolis Mass Flow, Density and Temperature Sensing with a Single Vacuum Sealed MEMS Chip", D. Sparks, R. Smith, S. Massoud-Ansari, and N. Najafi, Solid-State Sensor, Actuator and Microsystems Workshop (2004).

International Search Report and Written Opinion of the ISA issued in PCT/US2019/024583, dated Aug. 8, 2019; ISA/KR.

* cited by examiner

MEMS-BASED CORIOLIS MASS FLOW CONTROLLER

CROSS-REFERENCE TO RELATED APPLICATIONS

This application is a U.S. National Phase Application under 35 U.S.C. 371 of International Application No. PCT/US2019/024583, filed on Mar. 28, 2019, which claims the benefit of U.S. Provisional Application No. 62/650,657, filed on Mar. 30, 2018. The entire disclosures of the applications referenced above are incorporated herein by reference.

FIELD

The present disclosure relates to substrate processing, and more particularly to controlling flow of fluids such as gases in a substrate processing system using mass flow controllers including microelectromechanical (MEMS) Coriolis flow sensors.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit, etch, ash, clean or otherwise treat film on a substrate such as a semiconductor wafer. During treatment, the substrate may be arranged in a processing chamber and exposed to one or more gas mixtures. In some examples, plasma may be used to cause chemical reactions to occur.

Mass flow controllers are used to control metering of gases that are delivered to the substrate processing chamber. More recent recipes for processes such as chemical vapor deposition (CVD), atomic layer deposition (ALD) and/or atomic layer etching (ALE) require relatively low gas flow rates and fast gas exchange times. Problems have been encountered when using current mass flow controllers such as thermal or pressure based mass flow controllers for these applications.

SUMMARY

A mass flow controller assembly includes a housing defining a cavity, a plurality of internal passages, a first inlet, a first outlet, a second inlet, and a second outlet. A valve is connected to the housing, has an inlet fluidly coupled to the second outlet of the housing and an outlet fluidly coupled to the second inlet of the housing. The valve is configured to control fluid flow from the second outlet of the housing to the second inlet of the housing. A microelectromechanical (MEMS) Coriolis flow sensor is arranged in the cavity, includes an inlet fluidly coupled by at least one of the plurality of internal passages to the first inlet of the housing and is configured to measure at least one of a mass flow rate and density of fluid flowing through the MEMS Coriolis flow sensor. An outlet of the MEMS Coriolis flow sensor is fluidly coupled by at least one of the plurality of internal passages to the second outlet of the housing. The second inlet of the housing is fluidly coupled by at least one of the plurality of internal passages to the first outlet of the housing.

In other features, the housing includes a first housing portion, a second housing portion connected to the first housing portion, and a third housing portion connected to the second housing portion. The cavity is defined between the second housing portion and the third housing portion.

In other features, the valve is connected to the third housing portion. A printed circuit board is connected to the third housing portion adjacent to the valve. The first housing portion includes a removable filter in fluid communication with the first inlet and an inlet of the MEMS Coriolis flow sensor.

In other features, a first connector plug is arranged in a first cavity defined by the third housing portion. The first connector plug guides a plurality of conductors. First ends of the plurality of conductors are connected by a plurality of bond wires, respectively, to the MEMS Coriolis flow sensor. A second connector plug is arranged in a second cavity of the third housing portion. The second connector plug guides the plurality of conductors. Second ends of the plurality of conductors are connected to a plurality of traces, respectively, arranged on the printed circuit board.

In other features, a controller is connected by the plurality of traces, the plurality of conductors and the plurality of bond wires to the MEMS Coriolis flow sensor. The fluid comprises gas. Gas-exposed surfaces of components of the mass flow controller assembly are one of made of non-metallic materials; or coated with a non-metallic coating.

In other features, a plurality of fasteners connect the first housing portion, the second housing portion and the third housing portion together. A first seal is arranged between the first housing portion and the second housing portion. A second seal is arranged between the second housing portion and the third housing portion.

In other features, an inlet tube is connected to the first inlet of the housing. An outlet tube is connected to the first outlet of the housing. The inlet tube and the outlet tube are made of metal and include a non-metallic coating. The non-metallic coating is deposited using atomic layer deposition.

In other features, the MEMS Coriolis flow sensor includes a tube that is made of semiconductor material, that is vibrated at a resonant frequency during measurement and that has an internal diameter in a range from 10 μm to 100 μm. The MEMS Coriolis flow sensor is configured to measure flow rates that are less than 100 sccm. The housing is made of a material selected from a group consisting of stainless steel, aluminum, glass, ceramic, plastic and semiconductor material. The MEMS Coriolis flow sensor is bonded in the cavity to the second housing portion.

In other features, the MEMS Coriolis flow sensor includes a boron-free silicon surface. The second housing portion is made of stainless steel. The boron-free silicon surface is bonded in the cavity to the second housing portion.

In other features, the MEMS Coriolis flow sensor includes a capacitive sensing circuit arranged adjacent to the tube to generate a signal in response to movement of the tube. A control circuit includes an actuator circuit configured to vibrate the tube at a resonant frequency of the tube, and a readout circuit configured to receive the signal from the capacitive sensing circuit.

A substrate processing system comprises a processing chamber. A substrate support is arranged in the processing chamber to support a substrate. A gas delivery system is configured to deliver process gas mixtures to the processing chamber and includes the mass flow controller assembly.

A flow control system includes N mass flow controller assemblies arranged in parallel, where N is an integer greater than one. A first valve is connected to first inlets of the N mass flow controller assemblies. Outlets of the N mass flow controller assemblies are connected together. A bypass orifice is connected in parallel with the N mass flow controller assemblies.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems and methods according to the present disclosure relate to a mass flow controller (MFC) including a microelectromechanical (MEMS) Coriolis flow sensor to measure flow parameters such as mass flow rate and/or density of one or more gas flows delivered to a substrate processing chamber for semiconductor substrates. While the foregoing description describes measurement of mass flow rates of gases, the disclosure relates to mass flow control of other fluids such as liquids or mixtures of liquids and gases. Furthermore, while the present disclosure describes mass flow control in semiconductor processing environments, the foregoing disclosure applies to measurement of mass flow in any other environment.

In some examples described herein, the MEMS Coriolis flow sensor is fabricated using semiconductor processes and materials. Gases delivered by the gas delivery system in substrate processing systems may be delivered at relatively high pressures up to 60 psig. Systems and methods according to the present disclosure provide gas containment around the MEMS Coriolis flow sensor in the event that the MEMS Coriolis flow sensor fails. In some examples, the MEMS Coriolis flow sensor is mounted in a cavity defined between adjacent housing portions or blocks of a MFC assembly to provide containment of gases in the event that the MEMS Coriolis flow sensor fails.

In some examples described herein, a gas flow path from an inlet of the MFC assembly to an outlet of the MFC is metal free. In some examples, the gas flow path includes some components such as inlet tubes and outlet tubes that are made of metal such as stainless steel. Surfaces of the inlet tubes, outlet tubes, internal passages, seals, etc. that are made of metal and that are exposed to gases are coated with a nonmetallic coating. In some examples, one or more housing portions or blocks of the MFC assembly define internal passages for gas flow. In some examples, the housing portions are made of metal that has been coated with a non-metal material. Alternately, the housing portions are made of nonmetallic materials. The MEMS Coriolis flow sensor is made of one or more semiconductor materials. The valve may be made of nonmetallic materials or metallic materials with gas-exposed surfaces that are coated with a nonmetallic coating.

In some examples, multiple MEMS Coriolis flow sensors are arranged in parallel (with or without a bypass orifice) to accommodate higher flow rates than otherwise may be accommodated using a single MEMS Coriolis flow sensor.

In some examples, the MEMS Coriolis flow sensor includes an inlet, a tube, an outlet, an actuator circuit and a sensing circuit. While Coriolis mass flow sensors have been used to measure mass flow rates and density at high flow rates using stainless steel tubes, stainless steel tubes cannot be used for lower flow rates such as those less than 200 standard cubic centimeters (sccm). Some of the proposed applications described herein may require flow control at flow rates less than 100 sccm and in some situations less than 30 or even 10 sccm.

Due to the low flow rates to be measured, the diameter of the stainless steel tubes would be difficult or impossible to manufacture. In other words, to measure the mass flow rates that are desired, the inner diameter of the tubes will typically be on the order of tens of micrometers (e.g. less than 100 μm such as 30 μm) rather than the much larger diameters that are typically used for stainless steel tubes and higher flow rates. Additionally, first order resonance is determined by a root of a ratio of stiffness divided by mass. While stainless steel and semiconductor materials such as silicon have comparable stiffness values, silicon has a much smaller mass. Therefore, silicon has a higher resonance frequency. As a result, mass flow sensors using silicon are less prone to noise caused by vibration.

The tube of the MEMS Coriolis flow sensor is fabricated during semiconductor processing using a semiconductor material. For example, the tube may be formed by etching one-half of a predetermined profile in a desired shape of the tube into external surfaces of the first and second substrates. The predetermined profile may include a semicircular, elliptical, rectangular, "U"-shaped, and/or other profile. After the predetermined half profiles are etched, the first and second substrates are arranged in direct contact with the half profiles facing each other and aligned. The first and second substrates are then bonded together. Then, a conformal deposition process may be used to deposit a thin layer on an inner surface of the aligned profile to create the tube. For example, the tube may be made of silicon, silicon nitride, silicon dioxide, silicon carbide or other semiconductor material. Afterwards, the tube is removed from the first and second substrates. For example, the material of the first and second substrates is dissolved or removed using a material-selective etching process.

In use, a fluid such as a gas or liquid is input to the inlet of the MEMS Coriolis flow sensor. The fluid passes through the inlet, flows around the tube of the MEMS Coriolis sensor as the tube is vibrated and exits at the outlet. During measurement, a controller controls the actuator to vibrate the tube at a resonant frequency of the tube, receives and processes signals generated by the sensing circuit, and accurately calculates mass flow rate and density of the fluid based on the signals. The MEMS flow sensor accurately measures both the mass flow rate and the density of the fluid flowing through the sensor. The measurements are independent of temperature and pressure.

In some examples, the tube forms a curved loop such as a "D"-shaped loop with adjacent inlets and outlets. The actuator vibrates the tube at the resonant frequency of the tube. When the fluid is introduced into the tube, the resonant frequency of oscillation changes due to the increased inertia associated with the tube and the fluid in the tube. The change in resonant frequency of oscillation ($\Delta f_B$) is directly proportional to the density ($\rho$) of the fluid or $\Delta f_B \propto \rho$.

When fluid travels around the tube, fluid that travels away from an axis of oscillation exerts a force on a first section of the tube that extends away from the axis of oscillation near the inlet of the tube. The force exerted back onto the fluid causes the fluid to experience an increase in angular momentum to match the angular momentum of the tube. As the fluid travels back toward the axis of oscillation through a second section of the tube that extends back toward the axis of oscillation near the outlet, the fluid exerts a force on the second section as its angular momentum is made to decrease.

As a result, the first section of the tube experiences a negative phase shift relative to the central portion of the tube (e.g., the first section lags behind) whereas the second portion of the tube experiences a positive phase shift relative to the central portion of the tube (e.g., the second section oscillates ahead of the central portion of the tube). The degree of phase difference between the first portion and the second portion is directly proportional to the amount of mass or mass flow rate that is flowing through the tube of the MEMS Coriolis flow sensor.

The mass flow rate of a fluid through the MEMS Coriolis flow sensor is related to the phase shift or time lag between the first and second portions of the tube as set forth below:

$$Q_m = \frac{K_u - I_u \omega^2}{2Kd^2} \tau$$

where $K_u$ is the temperature dependent stiffness of the tube, K is a shape-dependent factor, d is the width of the tube, $\tau$ is the time lag, co is the oscillation or vibration frequency, and $I_u$ is the inertia of the tube.

Using the density measurement of the fluid that is measured by examining $\Delta f_B$ of the MEMS Coriolis flow sensor, the inertia $\omega$ may be calculated, resulting in an accurate reading of the mass flow rate of the fluid traveling through the MEMS Coriolis flow sensor. As a result, the MEMS Coriolis flow sensor provides accurate determinations of both density and mass flow rate.

In some examples, the MEMS Coriolis flow sensor provides at least two signals to the controller including a first signal related to density and a second signal related mass flow rate. For example, one signal may include oscillation frequency measurements of the tube and the other signal may include phase shift or time lag measurements. The controller receives the signals and calculates the density and the mass flow rate of the fluid traveling through the MEMS Coriolis flow sensor. The controller adjusts an opening in a valve arranged at an outlet (or inlet) of the MEMS Coriolis flow sensor to adjust the flow of the fluid to a desired flow rate. Various types of valves are contemplated including solenoid valves, piezoelectric valves, and MEMS valves.

Additional information relating to various types of MEMS Coriolis flow sensors can be found in "Micro-Coriolis Mass Flow Sensor with Integrated Capacitive Readout", J. Haneveld, T. S. J. Lammerink, M. J. de Boer and R. J. Wiegerink, 978-1-4244-2978-3/09 I.E.E.E. Transactions of Industrial Electronics (2009) and "Coriolis Mass Flow, Density and Temperature Sensing with a Single Vacuum Sealed MEMS Chip", D. Sparks, R. Smith, S. Massoud-Ansari, and N. Najafi, Solid-State Sensor, Actuator and Microsystems Workshop (2004), both of which are hereby incorporated herein by reference in their entirety.

Figure 1:
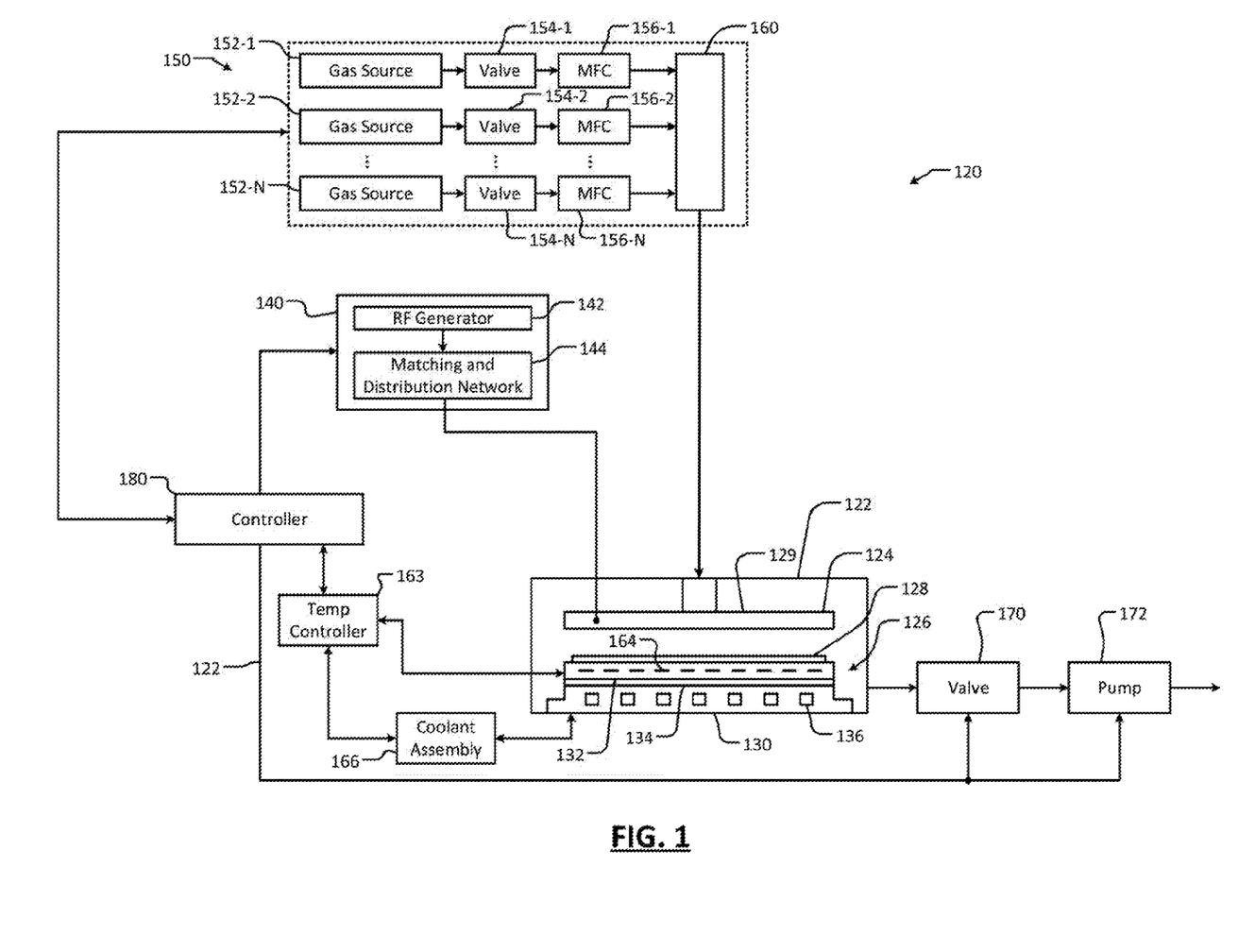
FIG. 1 is a functional block diagram of a substrate processing system including a mass flow controller (MFC) with a microelectromechanical (MEMS)-based Coriolis flow sensor according to the present disclosure.

Referring now to FIG. 1, an example substrate processing system 120 is shown. While a processing chamber for etching, chemical vapor deposition or atomic layer deposition (ALD) using capacitively coupled plasma (CCP) is shown, the MEMS-based Coriolis mass flow controllers and methods described herein can be used to sense mass flow rate and/or density of fluids in any other type of substrate processing systems. For example, the MEMS-based Coriolis mass flow controllers and methods described herein can be used in substrate processing systems using remote plasma or inductively coupled plasma (ICP). Additionally, substrate processing systems can be used in any other semiconductor equipment requiring precise mass flow control and/or density measurements such as spin chucks, etching systems, deposition systems, etc.

The substrate processing system 120 includes a processing chamber 122 that encloses other components of the substrate processing system 120 and contains the RF plasma (if used). The substrate processing system 120 includes an upper electrode 124 and an electrostatic chuck (ESC) 126 or other substrate support. During operation, a substrate 128 is arranged on the ESC 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The ESC 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

If plasma is used, an RF generating system 140 generates and outputs an RF voltage to one of the upper electrode 124 and the lower electrode (e.g., the baseplate 130 of the ESC 126). The other one of the upper electrode 124 and the baseplate 130 may be DC grounded, AC grounded or floating. For example only, the RF generating system 140 may include an RF generator 142 that generates RF power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and mass flow controllers 156-1, 156-2, . . . , and 156-N (collectively mass flow controllers 156) to a manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the ESC 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the ESC 126.

A valve 170 and pump 172 may be used to evacuate reactants from the processing chamber 122. A system controller 180 may be used to control components of the substrate processing system 120.

Figure 2:
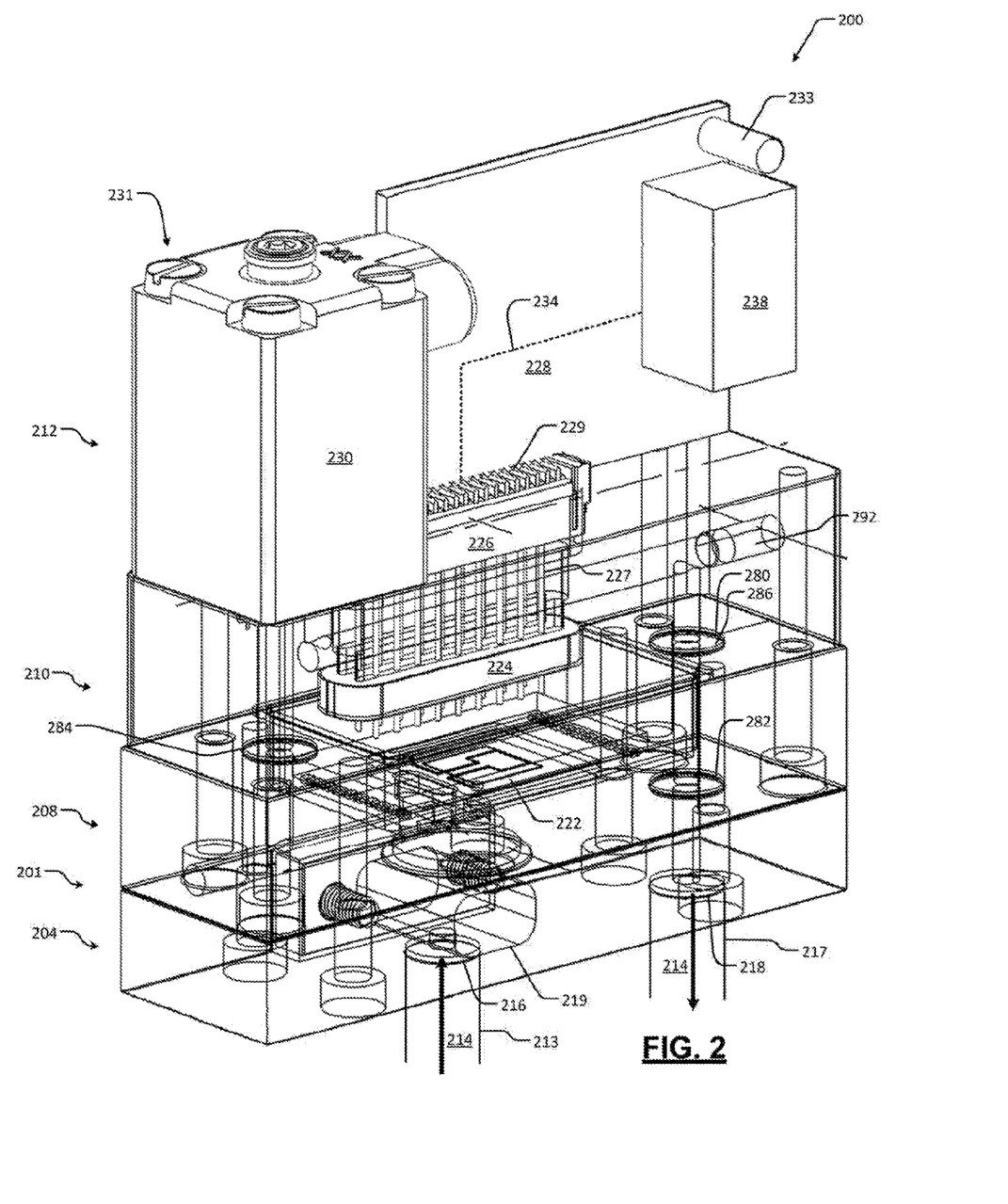
FIG. 2 is a perspective wire frame diagram of an MFC assembly including a MEMS Coriolis flow sensor according to the present disclosure.
Figure 3:
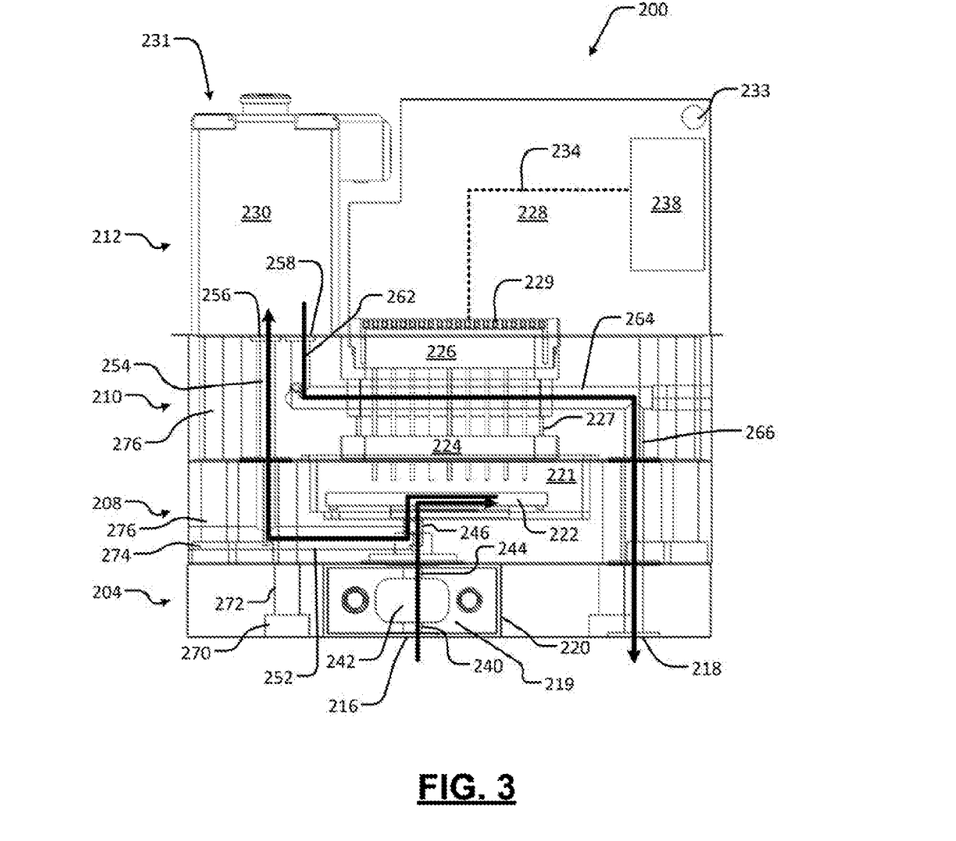
FIG. 3 is a first side view, wire frame diagram of the MFC assembly of FIG. 2 according to the present disclosure.
Figure 4:
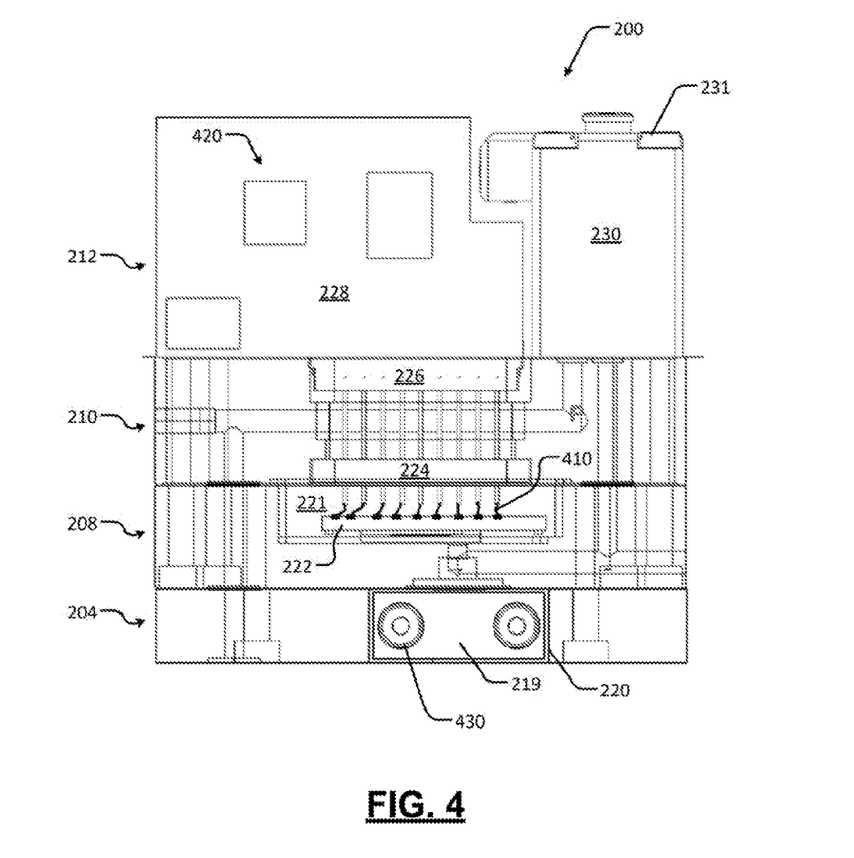
FIG. 4 is an opposite side view, wire frame diagram of the valve and control assembly of FIG. 2 according to the present disclosure.

Referring now to FIGS. 2-4, an MFC assembly 200 includes a housing 201 enclosing the MEMS Coriolis flow sensor. In some examples, the housing 201 includes a first housing portion 204, a second housing portion 208, and a third housing portion 210 that are attached together. As will be shown and described further below, one or more seals or sealing rings are used to provide seals between the first housing portion 204, the second housing portion 208 and/or the third housing portion 210 to provide primary or secondary fluid sealing. In some examples, the first housing portion 204, the second housing portion 208 and/or the third housing portion 210 are made of metal such as stainless steel or aluminum or a non-metallic material such as glass, ceramic, plastic (such as but not limited to polychlorotrifluoroethylene (PCTFE)) or semiconductor material.

In FIGS. 2-3, a valve and control portion 212 is arranged adjacent to the third housing portion 210. The first housing portion 204 is connected to an inlet tube 213. In some examples, the inlet tube 213 is made of a metal material such as stainless steel. In some examples, the inlet tube 213 includes a non-metallic coating 214 formed on inner surfaces of the inlet tube 213. In some examples, the non-metallic coating 214 includes a semiconductor material that is deposited thereon using a process such as ALD. In some examples, the non-metallic coating includes a material such as silicon (Si), silicon nitride ($Si_xN_y$) (where x and y are integers), silicon carbide (SiC), silicon dioxide ($SiO_2$), or other material. In some examples, the non-metallic coating has a thickness that is less than or equal to 5 nm, although thicker or thinner coatings can be used.

The first housing portion 204 includes an inlet 216 that is fluidly connected to the inlet tube 213 for receiving fluid such as a gas or liquid. An outlet tube 217 is connected to an outlet 218 for outputting the fluid after flow measurement and flow control using a valve. In some examples, the outlet tube 217 may also include the non-metallic coating 214 on inner surfaces thereof. In some examples, the first housing portion 204 further includes a filter element 219 removably received in a cavity 220 (FIG. 3) defined in the first housing portion 204. The filter element 219 filters the fluid entering the MFC assembly 200. In other examples, the first housing portion 204 is omitted and fluid is input to the second housing portion 208 without filtering.

The second housing portion 208 is arranged adjacent to and in sealing contact with the first housing portion 204. The second housing portion 208 defines a cavity 221 (FIG. 3) for receiving a MEMS Coriolis flow sensor 222. The second housing portion 208 also defines one or more internal passages for routing the fluid as will be described further below.

The third housing portion 210 is arranged adjacent to and in sealing contact with the second housing portion 208. The third housing portion 210 defines cavities to receive connector plugs 224, 226 and one or more internal passages for routing the fluid as will be described further below. The valve and control portion 212 includes a valve 230 connected by fasteners 231 to the third housing portion 210. A housing (not shown) may be arranged around the valve and control portion 212 during use. A spacer 233 may be used to maintain a predetermined clearance between the PCB 228 and the housing.

Conductors 227 are guided by the connector plugs 224, 226 from the cavity 221 to an opposing surface of the connector plug 226. Ends 229 of the conductors 227 attach to traces 234 of a printed circuit board (PCB) 228 to provide connections to one or more circuits (shown at 420 in FIG. 4) attached to the PCB 228 and/or with one or more external connectors (e.g. plug connector 238).

In FIG. 3, fluid flows into the inlet 216 through an internal passage 240 in the first housing portion 204 and through a filter medium 242. After being filtered by the filter medium 242, the fluid flows through passages 244, 246 to an inlet of the MEMS Coriolis flow sensor 222. The MEMS Coriolis flow sensor 222 is arranged in the cavity 221 defined by the second housing portion 208, although other locations can be used. The fluid passes through the tube of the MEMS Coriolis flow sensor 222. A fluid outlet of the MEMS Coriolis flow sensor 222 is connected by internal passages 252 and 254 to an inlet 256 of the valve 230. An outlet 258 of the valve 230 is connected by internal passages 262, 264 and 266 to the outlet 218.

In some examples, the first housing portion 204 is connected to the second housing portion 208 by one or more fasteners 270 located in bores 272 in the first housing portion 204 and the second housing portion 208. Likewise, the second housing portion 208 is connected to the third housing portion by one or more fasteners 274 arranged in bores 276 in the second housing portion 208 and the third housing portion 210.

In some examples, a seal ring such as "C"-seal (examples shown in FIGS. 5C and 5D) is used to provide a seal between the inlet tube 213 and the first housing portion 204. "C"-seals may also be used where the internal passages flow from one housing portion to another housing portion such as at locations identified at 280, 282 and 284 in FIG. 2. The C-seals are located in grooves 286 surrounding the corresponding internal passage. The grooves 286 may be formed in one or both of the housing portions and have a height that is less than a height of the C-seal in an uncompressed state. The C-seal is compressed and moves radially outwardly against a radially outer portion of the grooves 286 to form a seal when the adjacent housing portions are attached together by the fasteners.

In FIG. 4, bond wires or other connectors (generally identified at 410) may be used to connect terminals of the MEMS Coriolis flow sensor 222 to the conductors 227. The circuits 420 (such as one or more integrated circuits) are connected to the PCB 228. Fasteners 430 may be used to removably attach the filter element 219 in the cavity 220.

There are various ways to attach the MEMS Coriolis flow sensor 222 to the second housing portion 208 in the cavity 221. Examples include using a compressible elastomeric seal or a mechanical seal such as "C"-shaped seals or C seals. Pressure against the seals can be maintained by mechanical fasteners holding the components together. In other examples, a bonding material is applied between the MEMS Coriolis flow sensor 222 and the second housing portion 208, pressure is applied and the material is melted as will be described further below. In other examples, infrared (IR) heating can be used to melt the material of the second housing portion 208 to the material of the MEMS Coriolis flow sensor 222 as will be described further below. In still other examples, brazing can be used to attach the MEMS Coriolis flow sensor 222 to the second housing portion 208 in the cavity 221. Brazing involves joining components together by melting and flowing a filler metal into a joint where the filler metal has a lower melting point than the joined components.

Figure 5A:
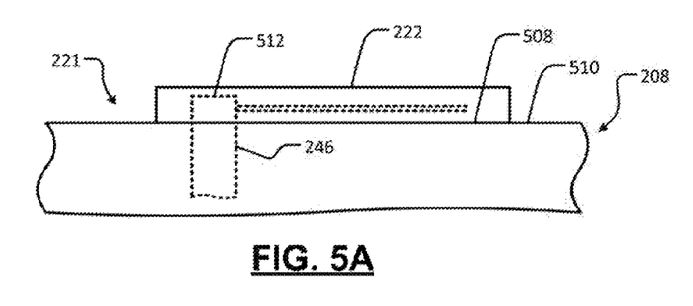
FIGS. 5A and 5B are side cross-sectional views illustrating attachment of the MEMS Coriolis flow sensor to the second housing portion according to the present disclosure.

Referring now to FIGS. 5A-5D, a bottom surface 508 of the MEMS Coriolis flow sensor 222 is shown attached to an upper surface 510 of the second housing portion 208 in the cavity 221. In FIG. 5A, the internal passage 246 formed in the second housing portion 208 delivers fluid to an inlet 512 of the MEMS Coriolis flow sensor 222. In some examples, the bottom surface 508 of the MEMS Coriolis flow sensor 222 is bonded to the upper surface 510 of the second housing portion in the cavity 221 using a bonding material. In some examples, the bonding material includes silicon (Si), silicon dioxide ($SiO_2$), silicon nitride (SiN), borosilicate glass, glass frit, quartz, and/or metal.

Figure 5B:
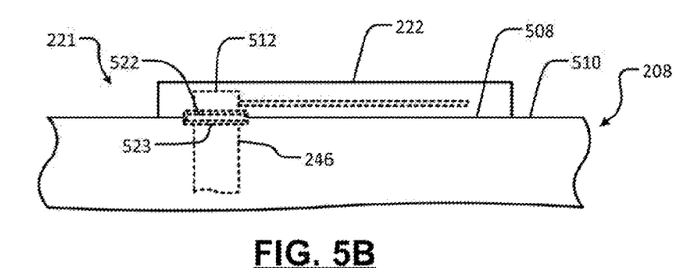
Figure 5C:
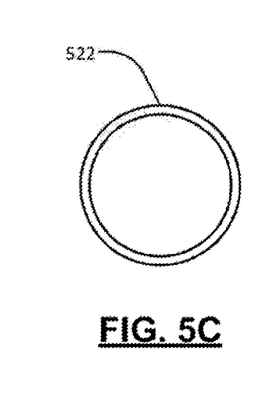
FIGS. 5C and 5D are plan and side views, respectively, of a C-seal according to the present disclosure.
Figure 5D:
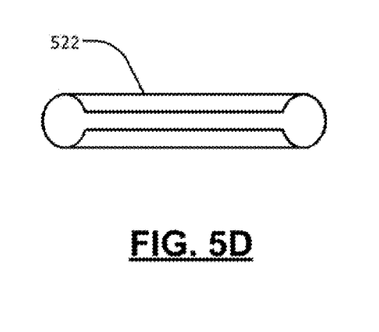

In other examples in FIG. 5B, a seal 522 may be used instead of or in addition to bonding of the bottom surface 508 of the MEMS Coriolis flow sensor 222 to the upper surface 510 of the second housing portion 208 in the cavity 221. The seal 522 is located in a groove 523 defined by one or both of the MEMS Coriolis flow sensor 222 and the second housing portion 208. The groove 523 has a height that is less than the uncompressed seal 522 when the MEMS Coriolis flow sensor 222 is connected to the second housing portion 208 to cause compression. In FIGS. 5C and 5D, an example of the seal 522 is shown. In these examples, the seal 522 includes a "C"-seal having a "C"-shaped cross-section that faces radially inwardly (as shown) or radially outwardly (not shown).

Figure 6A:
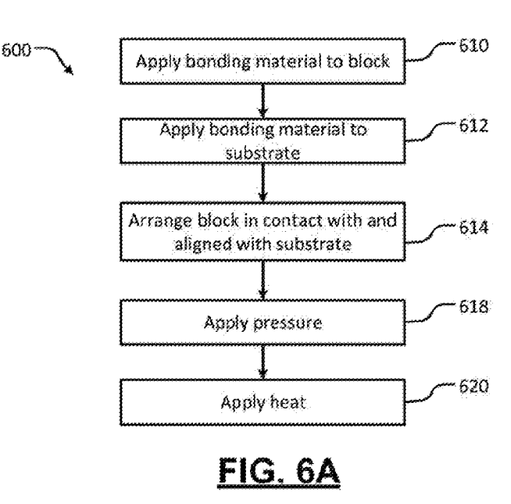
FIGS. 6A and 6B are flowcharts illustrating examples of methods for attaching the MEMS Coriolis flow sensor to the second housing portion according to the present disclosure.

Referring now to FIG. 6A, a method 600 for attaching the bottom surface 508 of the MEMS Coriolis flow sensor 222 to the upper surface 510 of the second housing portion in the cavity 221 is shown. At 610, bonding material is applied to the second housing portion in an area around the internal passage 246. At 612, bonding material is optionally also applied to a substrate of the MEMS Coriolis flow sensor 222 around the inlet and outlet. In some examples, the bonding material is applied using printing or deposition.

At 614, the internal passage 246 of the second housing portion 208 is arranged in contact and aligned with the inlet 512 (and outlet) of a substrate of the MEMS Coriolis flow sensor 222. At 618, pressure is applied to hold the components together. At 620, heat is applied. Heating can be performed using a flash lamp, a laser, an infrared heater, an inductive heater, a microwave heater, and/or other types of heaters. In some examples, the heating includes heating to a temperature in a range from 250° C. to 400° C. for a predetermined period.

Figure 6B:
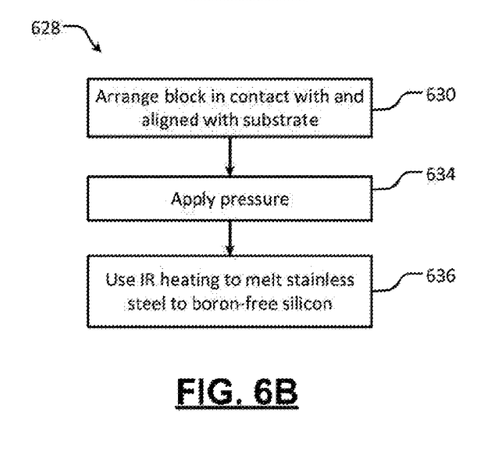

Referring now to FIG. 6B, another method 628 for attaching the bottom surface 508 of the MEMS Coriolis flow sensor 222 to the upper surface 510 of the second housing portion in the cavity 221 is shown. At 630, the internal passage 246 of the second housing portion 208 is arranged in contact and aligned with the inlet 512 (and outlet) of a substrate of the MEMS Coriolis flow sensor 222. At 634, pressure is applied. At 636, infrared heating is used to melt the stainless steel and/or a material of the substrate of the MEMS Coriolis flow sensor 222 to bond the bottom surface 508 of the MEMS Coriolis flow sensor 222 to the upper surface 510 of the second housing portion in the cavity 22. In some examples, a wavelength of the infrared heater is in a range from 3 to 6 μm or 4 to 5 μm.

Figure 7:
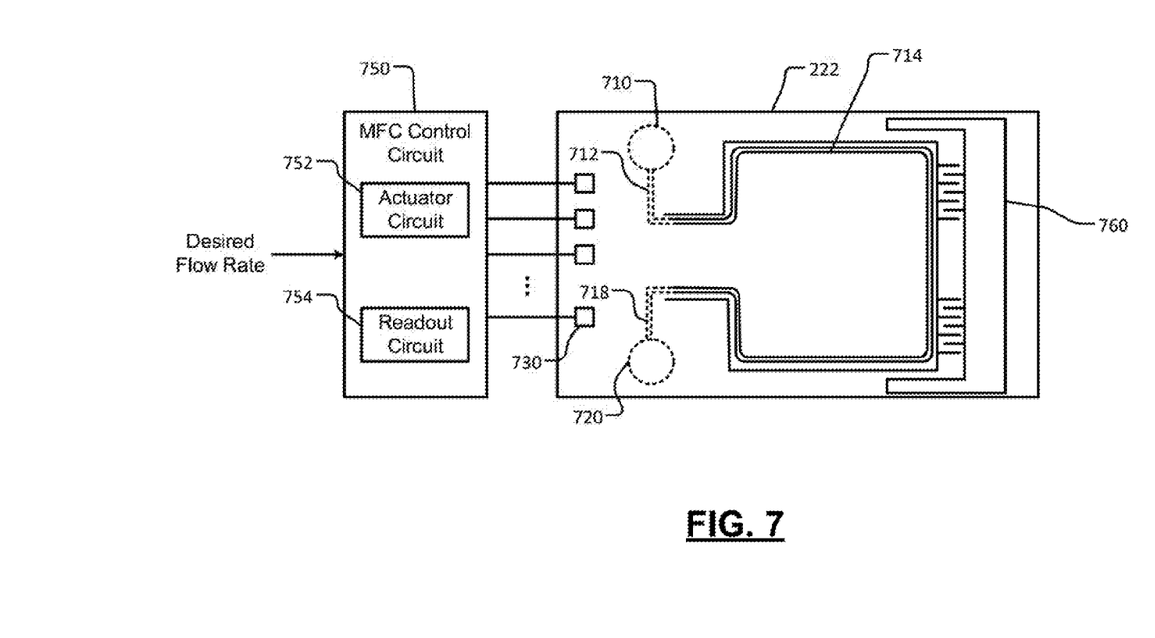
FIG. 7 is an electrical schematic and functional block diagram of an example of a controller for the MEMS Coriolis flow sensor and portions of the MEMS Coriolis flow sensor.

Referring now to FIG. 7, the MEMS Coriolis flow sensor 222 is shown in further detail. The MEMS Coriolis flow sensor 222 includes an inlet 710 connected by an internal passage 712 to a tube 714 made of a semiconductor material. An outlet of the tube 714 is connected by an internal passage 718 to the outlet 720 of the MEMS Coriolis flow sensor 222. The MEMS Coriolis flow sensor 222 further includes a plurality of external pads or contacts 730 that are connected to a MEMS control circuit 750. The MEMS control circuit 750 includes an actuator circuit 752 and a readout circuit 754. The actuator circuit 752 generates an output signal to vibrate the tube 714 at a resonant frequency of the tube 714. For example, the actuator circuit 752 creates electrostatic force that vibrates the tube 714. The readout circuit 754 is connected to a capacitive sensing circuit 700 to sense twisting of the tube 714, changes in the resonant frequency of the tube 714 and/or phase shift or time lag.

Figure 8:
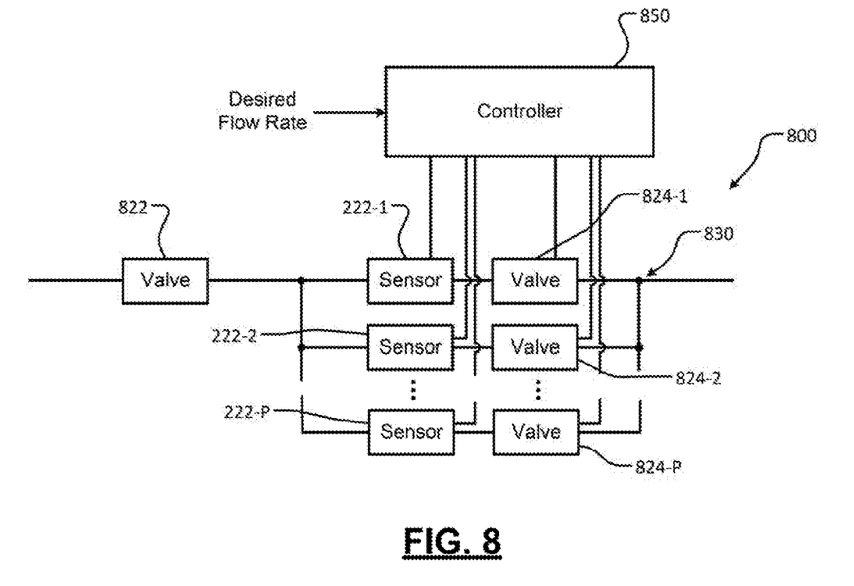
FIG. 8 is a functional block diagram of multiple MEMS Coriolis MFCs connected in parallel to accommodate higher mass flow rates.

Referring now to FIG. 8, a flow rate range of the MEMS Coriolis flow sensors may be limited to a maximum flow rate that is less than a desired flow rate range for a gas in a given process. An array 800 of MEMS Coriolis flow sensors 222-1, 222-2, . . . , and 222-P (where P is an integer greater than one) that are connected in parallel can be used to increase the flow rate range for the gas.

An inlet of a valve 822 receives a gas or gas mixture from one or more gas sources. An outlet of the valve 822 is connected to inlets of the MEMS Coriolis flow sensors 222-1, 222-2, . . . , and 222-P. An outlet of the MEMS Coriolis flow sensors 222-1, 222-2, . . . , and 222-P are connected to corresponding valves 824-1, 824-2, . . . , and 824-P. Outlets of the valves 824-1, 824-2, . . . , and 824-P are connected to a common node 830 for delivery to a processing chamber, manifold, showerhead or other location. In some examples, the MEMS Coriolis flow sensors 222-1, 222-2, . . . , and 222-P have the same flow rate range. In other examples, the MEMS Coriolis flow sensors 222-1, 222-2, . . . , and 222-P have different flow rate ranges.

A controller 850 communicates with the MEMS Coriolis flow sensors 222-1, 222-2, . . . , and 222-P and the valves 824-1, 824-2, . . . , and 824-P. In use, the controller 850 controls the valve 822 and the valves 824-1, 824-2, . . . , and 824-P based upon feedback from the MEMS Coriolis flow sensors 222-1, 222-2, . . . , and 222-P to provide a desired flowrate.

Figure 9:
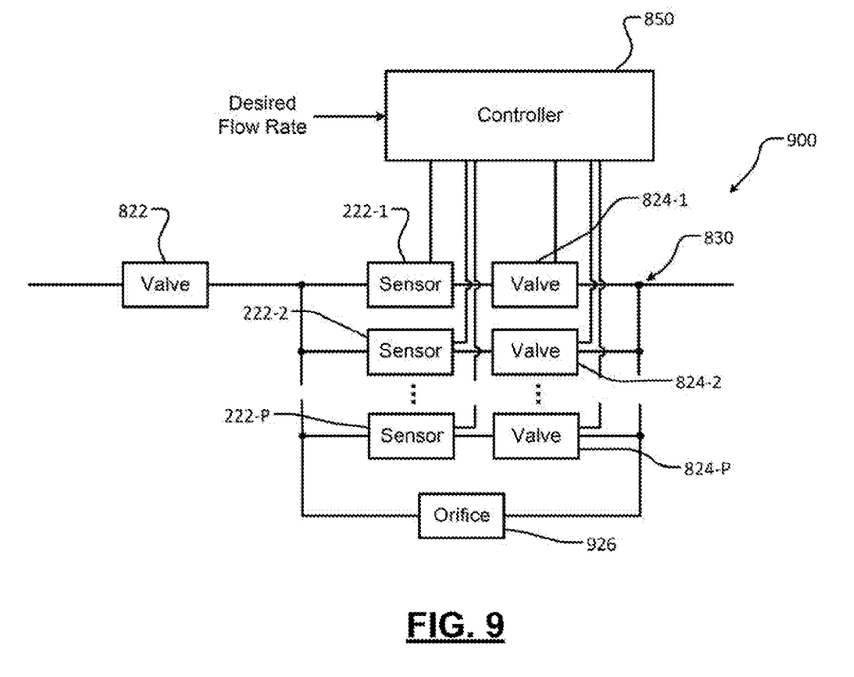
FIG. 9 is a functional block diagram of multiple MEMS Coriolis MFCs connected in parallel and a bypass path to accommodate higher mass flow rates.

Referring now to FIG. 9, a flow rate range of the MEMS Coriolis flow sensors may be limited to a maximum flow rate that is less than a desired flow rate range for a gas in a given process. An array 900 of MEMS Coriolis flow sensors 222-1, 222-2, . . . , and 222-P (where P is an integer greater than one) and an orifice 926 that are connected in parallel can be used to increase the flow rate range.

An inlet of a shut off valve 922 receives a gas or gas mixture from one or more gas sources. An outlet of the valve 922 is connected to inlets of the MEMS Coriolis flow sensors 222-1, 222-2, . . . , and 222-P and to the orifice 926. Some of the gas flows through the orifice 926 and the remainder of the gas flows through the MEMS Coriolis flow sensors 222-1, 222-2, . . . , and 222-P.

An outlet of the MEMS Coriolis flow sensors 222-1, 222-2, . . . , and 222-P are connected to corresponding valves 924-1, 924-2, . . . , and 924-P. Outlets of the valves 924-1, 924-2, . . . , and 924-P and the orifice 926 are connected to a common node 930 for delivery. In some examples, the MEMS Coriolis flow sensors 222-1, 222-2, . . . , and 222-P have the same flow rate range. In other examples, the MEMS Coriolis flow sensors 222-1, 222-2, . . . , and 222-P have different flow rate ranges.

The controller 850 communicates with the MEMS Coriolis flow sensors 222-1, 222-2, . . . , and 222-P and the valves 824-1, 824-2, . . . , and 824-P. In use, the controller 850 controls the valve 822 and the valves 824-1, 824-2, . . . , and 824-P based upon feedback from the MEMS Coriolis flow sensors 222-1, 222-2, . . . , and 222-P to provide a desired flowrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the processing chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A mass flow controller assembly comprising:
   a housing defining a cavity, a plurality of internal passages, a first inlet, a first outlet, a second inlet, and a second outlet;
   a valve connected to the housing, having an inlet fluidly coupled to the second outlet of the housing and an outlet fluidly coupled to the second inlet of the housing, wherein the valve is configured to control fluid flow from the second outlet of the housing to the second inlet of the housing; and
   a microelectromechanical (MEMS) Coriolis flow sensor arranged in the cavity, including an inlet fluidly coupled by at least one of the plurality of internal passages to the first inlet of the housing and configured to measure at least one of a mass flow rate and density of fluid flowing through the MEMS Coriolis flow sensor,
   wherein an outlet of the MEMS Coriolis flow sensor is fluidly coupled by at least one of the plurality of internal passages to the second outlet of the housing,
   wherein the second inlet of the housing is fluidly coupled by at least one of the plurality of internal passages to the first outlet of the housing; and
   wherein the housing includes:
   a first housing portion;
   a second housing portion connected to the first housing portion; and
   a third housing portion connected to the second housing portion,
   wherein the cavity is defined between the second housing portion and the third housing portion;
   wherein the valve is connected to the third housing portion; and
   wherein the mass flow controller assembly further comprises a printed circuit board connected to the third housing portion adjacent to the valve.

2. The mass flow controller assembly of claim 1, wherein the first housing portion includes a removable filter in fluid communication with the first inlet and an inlet of the MEMS Coriolis flow sensor.

3. The mass flow controller assembly of claim 1, further comprising a first connector plug arranged in a first cavity defined by the third housing portion.

4. The mass flow controller assembly of claim 3, wherein the first connector plug guides a plurality of conductors, wherein first ends of the plurality of conductors are connected by a plurality of bond wires, respectively, to the MEMS Coriolis flow sensor.

5. The mass flow controller assembly of claim 4, further comprising a second connector plug arranged in a second cavity of the third housing portion.

6. The mass flow controller assembly of claim 5, wherein the second connector plug guides the plurality of conductors, and wherein second ends of the plurality of conductors are connected to a plurality of traces, respectively, arranged on the printed circuit board.

7. The mass flow controller assembly of claim 6, further comprising a controller connected by the plurality of traces, the plurality of conductors and the plurality of bond wires to the MEMS Coriolis flow sensor.

8. The mass flow controller assembly of claim 1, wherein the fluid comprises gas and wherein gas-exposed surfaces of components of the mass flow controller assembly are one of:
   made of non-metallic materials; or
   coated with a non-metallic coating.

9. The mass flow controller assembly of claim 1, further comprising a plurality of fasteners connecting the first housing portion, the second housing portion and the third housing portion together.

10. The mass flow controller assembly of claim 9, further comprising:
    a first seal arranged between the first housing portion and the second housing portion; and
    a second seal arranged between the second housing portion and the third housing portion.

11. The mass flow controller assembly of claim 1, wherein the MEMS Coriolis flow sensor includes a tube that is made of semiconductor material, that is vibrated at a resonant frequency during measurement and that has an internal diameter in a range from 10 μm to 100 μm.

12. The mass flow controller assembly of claim 11, wherein the MEMS Coriolis flow sensor includes:
    a capacitive sensing circuit arranged adjacent to the tube to generate a signal in response to movement of the tube; and
    a control circuit including:
       an actuator circuit configured to vibrate the tube at the resonant frequency of the tube; and
       a readout circuit configured to receive the signal from the capacitive sensing circuit.

13. The mass flow controller assembly of claim 1, wherein the MEMS Coriolis flow sensor is configured to measure flow rates that are less than 100 sccm.

14. The mass flow controller assembly of claim 1, wherein the housing is made of a material selected from a group consisting of stainless steel, aluminum, glass, ceramic, plastic and semiconductor material.

15. The mass flow controller assembly of claim 1, wherein the MEMS Coriolis flow sensor is bonded in the cavity to the second housing portion.

16. The mass flow controller assembly of claim 1, wherein:
the MEMS Coriolis flow sensor includes a boron-free silicon surface,
the second housing portion is made of stainless steel, and
the boron-free silicon surface is bonded in the cavity to the second housing portion.

17. A mass flow controller assembly comprising:
a housing defining a cavity, a plurality of internal passages, a first inlet, a first outlet, a second inlet, and a second outlet;
a valve connected to the housing, having an inlet fluidly coupled to the second outlet of the housing and an outlet fluidly coupled to the second inlet of the housing, wherein the valve is configured to control fluid flow from the second outlet of the housing to the second inlet of the housing; and
a microelectromechanical (MEMS) Coriolis flow sensor arranged in the cavity, including an inlet fluidly coupled by at least one of the plurality of internal passages to the first inlet of the housing and configured to measure at least one of a mass flow rate and density of fluid flowing through the MEMS Coriolis flow sensor,
wherein an outlet of the MEMS Coriolis flow sensor is fluidly coupled by at least one of the plurality of internal passages to the second outlet of the housing, and wherein the second inlet of the housing is fluidly coupled by at least one of the plurality of internal passages to the first outlet of the housing;
an inlet tube connected to the first inlet of the housing; and
an outlet tube connected to the first outlet of the housing;
wherein the housing includes:
a first housing portion;
a second housing portion connected to the first housing portion; and
a third housing portion connected to the second housing portion,
wherein the cavity is defined by the second housing portion and the third housing portion;
wherein the valve is connected to the third housing portion;
wherein a printed circuit board is connected to the third housing portion adjacent to the valve; and
wherein the MEMS Coriolis flow sensor includes a boron-free silicon surface, the second housing portion is made of stainless steel, and the boron-free silicon surface is bonded in the cavity to the second housing portion.

18. The mass flow controller assembly of claim 17, wherein the inlet tube and the outlet tube are made of metal and include a non-metallic coating.

19. The mass flow controller assembly of claim 18, wherein the non-metallic coating is deposited using atomic layer deposition.

20. A substrate processing system comprising:
a processing chamber;
a substrate support arranged in the processing chamber to support a substrate;
a gas delivery system configured to deliver process gas mixtures to the processing chamber; and
a mass flow controller assembly comprising:
a housing defining a cavity, a plurality of internal passages, a first inlet, a first outlet, a second inlet, and a second outlet;
a valve connected to the housing, having an inlet fluidly coupled to the second outlet of the housing and an outlet fluidly coupled to the second inlet of the housing, wherein the valve is configured to control fluid flow from the second outlet of the housing to the second inlet of the housing; and
a microelectromechanical (MEMS) Coriolis flow sensor arranged in the cavity, including an inlet fluidly coupled by at least one of the plurality of internal passages to the first inlet of the housing and configured to measure at least one of a mass flow rate and density of fluid flowing through the MEMS Coriolis flow sensor,
wherein an outlet of the MEMS Coriolis flow sensor is fluidly coupled by at least one of the plurality of internal passages to the second outlet of the housing, and
wherein the second inlet of the housing is fluidly coupled by at least one of the plurality of internal passages to the first outlet of the housing;
wherein the housing includes:
a first housing portion;
a second housing portion connected to the first housing portion; and
a third housing portion connected to the second housing portion, wherein the cavity is defined between the second housing portion and the third housing portion; and
wherein:
the MEMS Coriolis flow sensor includes a boron-free silicon surface,
the second housing portion is made of stainless steel, and
the boron-free silicon surface is bonded in the cavity to the second housing portion.

21. The mass flow controller assembly of claim 20, wherein the valve is connected to the third housing portion and further comprising a printed circuit board connected to the third housing portion adjacent to the valve.

22. A flow control system comprising:
N mass flow controller assemblies arranged in parallel, where N is an integer greater than one, each mass flow controller assembly comprising:
a housing defining a cavity, a plurality of internal passages, a first inlet, a first outlet, a second inlet, and a second outlet;
a valve connected to the housing, having an inlet fluidly coupled to the second outlet of the housing and an outlet fluidly coupled to the second inlet of the housing, wherein the valve is configured to control fluid flow from the second outlet of the housing to the second inlet of the housing; and
a microelectromechanical (MEMS) Coriolis flow sensor arranged in the cavity, including an inlet fluidly coupled by at least one of the plurality of internal passages to the first inlet of the housing and configured to measure at least one of a mass flow rate and density of fluid flowing through the MEMS Coriolis flow sensor,
wherein an outlet of the MEMS Coriolis flow sensor is fluidly coupled by at least one of the plurality of internal passages to the second outlet of the housing, and
wherein the second inlet of the housing is fluidly coupled by at least one of the plurality of internal passages to the first outlet of the housing; and
a first valve connected to first inlets of the N mass flow controller assemblies,
wherein outlets of the N mass flow controller assemblies are connected together;

wherein the housing includes:
a first housing portion;
a second housing portion connected to the first housing portion; and
a third housing portion connected to the second housing portion,
wherein the cavity is defined by the second housing portion and the third housing portion;
wherein the valve is connected to the third housing portion; and
wherein a printed circuit board is connected to the third housing portion adjacent to the valve.

23. The flow control system of claim 22, further comprising a bypass orifice connected in parallel with the N mass flow controller assemblies.

* * * * *